United States Patent
Zahur et al.

(10) Patent No.: US 11,231,520 B2
(45) Date of Patent: Jan. 25, 2022

(54) DYNAMIC HYDROCARBON WELL SKIN MODELING AND OPERATION

(71) Applicant: Saudi Arabian Oil Company, Dhahran (SA)

(72) Inventors: Jawad Zahur, Abqaiq (SA); Mohammed Khalid Mugharbil, Khobar (SA); Ayedh Al-Shehri, Abqaiq (SA); Obiomalotaoso Isichei, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 58 days.

(21) Appl. No.: 16/867,825

(22) Filed: May 6, 2020

(65) Prior Publication Data
US 2021/0349237 A1 Nov. 11, 2021

(51) Int. Cl.
*G01V 99/00* (2009.01)
*E21B 47/06* (2012.01)
*G06F 30/20* (2020.01)

(52) U.S. Cl.
CPC ............ *G01V 99/005* (2013.01); *E21B 47/06* (2013.01); *G06F 30/20* (2020.01); *E21B 2200/20* (2020.05)

(58) Field of Classification Search
CPC ....... G01V 99/005; G06F 30/20; E21B 47/06; E21B 2200/20
USPC .......................................................... 703/10
See application file for complete search history.

(56) References Cited

U.S. PATENT DOCUMENTS

| 5,970,422 A | 10/1999 | Brady et al. |
| 5,992,519 A | 11/1999 | Ramakrishnan et al. |
| 6,842,700 B2 | 1/2005 | Poe |
| 7,739,089 B2 | 6/2010 | Gurpinar et al. |

(Continued)

FOREIGN PATENT DOCUMENTS

| CN | 101560879 A | 10/2009 |
| CN | 104989385 A | 10/2015 |

(Continued)

OTHER PUBLICATIONS

Petrowiki; "Formation damage" available as of Feb. 20, 2020 at: https://petrowiki.org/Formation_damage; pp. 1-7.

(Continued)

*Primary Examiner* — Justin C Mikowski
(74) *Attorney, Agent, or Firm* — Bracewell LLP; Constance G. Rhebergen; Christopher L. Drymalla

(57) ABSTRACT

Provided are techniques that include determining a first set of operating parameters for a hydrocarbon well for a first period; determining, based on the first set of operating parameters, a skin factor ($S_1$); determining, based on the skin factor ($S_1$), a well model for the well; determining, a second set of operating parameters for the well for a second period; determining, based on the second set of operating parameters, well performance characteristics for the second period that include: a well pressure and a production flowrate for the second period of time; determining that the well performance characteristics for the second period are not consistent with the well model and, in response: determining, based on the second set of operating parameters, an updated skin factor; and determining, based on the updated skin factor ($S_2$), an updated well model for the well.

24 Claims, 5 Drawing Sheets

(56) References Cited

U.S. PATENT DOCUMENTS

| | | | |
|---|---|---|---|
| 7,813,935 B2 | 10/2010 | Chitty et al. | |
| 8,612,194 B2 | 12/2013 | Horne et al. | |
| 8,620,636 B2 | 12/2013 | Zhan et al. | |
| 8,688,426 B2 | 4/2014 | Al-Shammari | |
| 8,738,342 B2 | 5/2014 | Lind et al. | |
| 8,914,268 B2 | 12/2014 | Dale et al. | |
| 9,022,140 B2 | 5/2015 | Marx et al. | |
| 9,085,966 B2 | 7/2015 | Rahman et al. | |
| 9,262,561 B2 | 2/2016 | Likanapaisal | |
| 9,471,730 B2 | 10/2016 | Adeniji et al. | |
| 9,617,839 B2* | 4/2017 | Modavi | E21B 43/28 |
| 10,221,659 B2 | 3/2019 | Baranov et al. | |
| 10,577,894 B1 | 3/2020 | Basu et al. | |
| 2009/0276156 A1 | 11/2009 | Kragas et al. | |
| 2010/0023269 A1* | 1/2010 | Yusti | E21B 49/008 702/12 |
| 2010/0133005 A1* | 6/2010 | Bell | E21B 43/117 175/2 |
| 2011/0022368 A1 | 1/2011 | Huang et al. | |
| 2011/0257577 A1* | 10/2011 | Lane | A61M 1/3655 604/6.11 |
| 2014/0182841 A1 | 7/2014 | Lecerf et al. | |
| 2015/0345267 A1* | 12/2015 | Modavi | E21B 43/25 166/271 |
| 2016/0312552 A1 | 10/2016 | Early et al. | |
| 2017/0292377 A1* | 10/2017 | Ramakrishnan | G01F 5/00 |
| 2018/0094517 A1 | 4/2018 | Foubert et al. | |
| 2018/0240021 A1 | 8/2018 | Al-Harbi et al. | |
| 2018/0320512 A1* | 11/2018 | Anisur Rahman | E21B 47/06 |
| 2019/0179988 A1 | 6/2019 | Malik et al. | |
| 2019/0323323 A1 | 10/2019 | Zhang et al. | |
| 2021/0270109 A1* | 9/2021 | Wasden | E21B 49/087 |

FOREIGN PATENT DOCUMENTS

| | | |
|---|---|---|
| CN | 109469478 A | 3/2019 |
| CN | 110593860 A | 12/2019 |
| WO | 2017223483 A1 | 12/2017 |

OTHER PUBLICATIONS

PT production-technology.org/introduction-ipr-vlp/; "Introduction to IPR and VLP" May 11, 2017; pp. 1-3.

International Search Report and Written Opinion for International Application No. PCT/US2021/031151, dated Aug. 30, 2021; pp. 1-15.

* cited by examiner

| Parameter | Value |
|---|---|
| SBHP | 3,000 psi |
| $B_o$ | 1.35 lb/stb |
| FWHP | 550 psi |
| GOR | 750 scf/stb |
| SBHT | 200 F |
| Water cut | 25% |
| FBHP | 1,511 psi |
| k | 100 md |
| h | 100 ft |
| µ | 0.7 cp |
| $r_w$ | 0.25 ft |
| $r_e$ | 11,775 ft |
| q | 4,580 stb/day |

| Parameter | Value |
|---|---|
| SBHP | 3,000 psi |
| $B_o$ | 1.35 lb/stb |
| FWHP | 550 psi |
| GOR | 750 scf/stb |
| SBHT | 200 F |
| Water cut | 25% |
| FBHP | 1,397 psi |
| k | 100 md |
| h | 100 ft |
| µ | 0.7 cp |
| $r_w$ | 0.25 ft |
| $r_e$ | 11,775 ft |
| q | 2,962 stb |

DYNAMIC HYDROCARBON WELL SKIN MODELING AND OPERATION

FIELD

Embodiments relate generally to developing hydrocarbon wells, and more particularly to operating hydrocarbon wells based on dynamic modeling of well skin.

BACKGROUND

A well typically includes a wellbore (or a "borehole") that is drilled into the earth to provide access to a geologic formation that resides below the earth's surface (or a "subsurface formation"). A well may facilitate the extraction of natural resources, such as hydrocarbons and water, from a subsurface formation, facilitate the injection of substances into the subsurface formation, or facilitate the evaluation and monitoring of the subsurface formation. In the petroleum industry, hydrocarbon wells are often drilled to extract (or "produce") hydrocarbons, such as oil and gas, from subsurface formations.

Developing a hydrocarbon well for production typically involves a drilling stage, a completion stage and a production stage. The drilling stage involves drilling a wellbore into a portion of the formation that is expected to contain hydrocarbons (often referred to as a "hydrocarbon reservoir" or a "reservoir"). The drilling process is often facilitated by a drilling rig that sits at the earth's surface and that facilitates a variety of drilling operations, such as operating a drill bit to cut the wellbore. The completion stage involves operations for making the well ready to produce hydrocarbons, such as installing casing, installing production tubing, installing valves for regulating production flow, or pumping substances into the well to fracture, clean or otherwise prepare the reservoir and well to produce hydrocarbons. The production stage involves producing hydrocarbons from the reservoir by way of the well. During the production stage, the drilling rig is typically replaced with a production tree that includes valves that are operated to, for example, regulate production flowrate and pressure. The production tree typically includes an outlet that is connected to a distribution network of midstream facilities, such as tanks, pipelines or transport vehicles that transport production from the well to downstream facilities, such as refineries or export terminals.

The various stages of developing a hydrocarbon well can include a variety of challenges that are addressed to successfully develop the well. For example, during production operations, a well operator typically controls the rate of production from the well to optimize the overall production of hydrocarbons from the reservoir. The rate of production may be varied based on a number of factors, such as physical characteristics of the wellbore, the formation, the production, and operations of nearby wells.

SUMMARY

Controlling a hydrocarbon well's production rate and pressure can be an important aspect of effectively and efficiently developing a hydrocarbon well. For example, holding a well's production rate at a relatively high level for an extended period of time can increase a risk of premature well depletion, water breakthrough, or other complications. On the other hand, holding a well's production at relatively low level for an extended period of time can reduce production and increase a marginal cost of production. In addition to these general considerations, a well operator may consider other factors that can influence development of a well. For example, formation rock surrounding the wellbore of a well may be invaded by drilling fluids or other debris that can create a zone of reduced formation permeability in the vicinity of the wellbore. This influence on the permeability is often referred to as "skin damage" (or "skin"), which is characterized by a skin factor (S). The skin factor (S) for a wellbore extending into a formation may include a dimensionless measure of pressure drop caused by flow restriction in the near-wellbore region of the formation. A well operator may consider skin in determining operational parameters for a well. In some instances, the impact of skin on productivity of a well can be characterized by inflow performance relationships (IPRs) which illustrate bottom hole pressure (BHP) of the well as a function of production flowrate (q) of the well. Unfortunately, the skin factor (S) for a well can change over the life of the well. This can render existing characterizations of skin inaccurate, and reduce the accuracy and usefulness of well modeling based on the characterizations.

Provided are systems and method for developing a hydrocarbon well based on dynamic updating of a skin factor (S) (and corresponding well models) to reflect observed performance of the well. In some embodiments, the well model associated with a hydrocarbon well is dynamically updated to reflect the current performance of the well. This may include, for example, the following operations: (1) determining a first set of operating parameters for a hydrocarbon well that are indicative of observed performance of the well over a first period of time; (2) determining, based on the first set of operating parameters for the well, a first/initial skin factor ($S_1$) for the well; (3) determining, based on the first/initial skin factor ($S_1$) for the well, a first well model for the well that defines a first/initial relationship of flowing well pressure of the well (e.g., flowing bottom hole pressure (FBHP)) to production flowrate of the well; (4) determining, a second set of operating parameters for the well that are indicative of observed performance of the well over a second period of time; (5) determining, based on the second set of operating parameters for the well, well performance characteristics for the second period of time that include the following: (a) a flowing well pressure of the well associated with the second period of time (e.g., an average flowing bottom hole pressure (FBHP) for the second period of time); and (b) a production flowrate of the well for the second period of time (e.g., an average production flowrate (q) of the well for the second period of time); (6) determining, based on a comparison of the well performance characteristics for the second period of time to the first well model for the well, that the well performance characteristics for the second period of time are not consistent with the first well model for the well; (7) in response to determining that the well performance characteristics for the second period of time are not consistent with the first well model for the well: (a) determining, based on the second set of operating parameters for the well, a second/updated skin factor ($S_2$) for the well; and (b) determining, based on the second/updated skin factor ($S_2$) for the well, a second/updated well model for the well that defines a second/updated relationship of flowing well pressure of the well to production flowrate of the well. The second/updated well model may be associated with the well in place of the first/initial well model. A similar dynamic updating process may be completed for the second/updated well model to associate a third/updated well model with the well, and so forth. Such dynamic updating of the well model may ensure that the well model currently associated with the well at any given time reflects operating conditions of the well.

In some embodiments, determining that well performance characteristics for a second period of time are not consistent with the first/initial well model for the hydrocarbon well includes comparing well certain well performance characteristics for the second period of time with acceptable ranges of those well performance characteristics. For example, determining that the well performance characteristics for the second period of time are not consistent with the first well model for the hydrocarbon well may include: (a) determining, based on the first/initial relationship of flowing well pressure of the well to production flowrate of the well, a first/initial acceptable range for each of flowing well pressure and production flowrate; (b) determining that the flowing well pressure of the well for the second period of time does not correspond to the first/initial acceptable range for flowing well pressure, or that the production flowrate of the well for the second period of time does not correspond to the first/initial acceptable range for production flowrate; and (c) determining, in response to the "out-of-range" determination, that the well performance characteristics for the second period of time are not consistent with the first well model for the well. In some embodiments, the well is developed based on a well model currently associated with the well. For example, a well control system (or another operator of the well) may determine, based on the second/updated relationship of flowing well pressure of the second well model for the well, a target production flowrate ($q_T$), and the well control system (or another operator of the well) may control the production system to operate the well at the target production flowrate ($q_T$).

Provided in some embodiments is a method of developing a hydrocarbon well that includes: determining a first set of operating parameters for a hydrocarbon well that are indicative of observed performance of the hydrocarbon well over a first period of time; determining, based on the first set of operating parameters for the hydrocarbon well, a first skin factor ($S_1$) for the hydrocarbon well; determining, based on the first skin factor ($S_1$) for the hydrocarbon well, a first well model for the hydrocarbon well that defines a first relationship of flowing well pressure of the hydrocarbon well to production flowrate of the hydrocarbon well; determining, a second set of operating parameters for the hydrocarbon well that are indicative of observed performance of the hydrocarbon well over a second period of time that is subsequent to the first period of time; determining, based on the second set of operating parameters for the hydrocarbon well, well performance characteristics for the second period of time that comprise: a flowing well pressure of the hydrocarbon well for the second period of time; and a production flowrate of the hydrocarbon well for the second period of time; determining, based on a comparison of the well performance characteristics for the second period of time to the first well model for the hydrocarbon well, that the well performance characteristics for the second period of time are not consistent with the first well model for the hydrocarbon well, the determining that the well performance characteristics for the second period of time are not consistent with the first well model for the hydrocarbon well comprising: determining, based on the first relationship of flowing well pressure of the hydrocarbon well to production flowrate of the hydrocarbon well: a first acceptable range of flowing well pressure; and a first acceptable range of production flowrate; determining that at least one of the flowing well pressure of the hydrocarbon well for the second period of time does not correspond to the first acceptable range of flowing well pressure or the production flowrate of the hydrocarbon well for the second period of time does not correspond to the first acceptable range of production flowrate; and determining, in response to determining that at least one of the flowing well pressure of the hydrocarbon well for the second period of time does not correspond to the first acceptable range of flowing well pressure or the production flowrate of the hydrocarbon well for the second period of time does not correspond to the first acceptable range of production flowrate, that the well performance characteristics for the second period of time are not consistent with the first well model for the hydrocarbon well; in response to determining that the well performance characteristics for the second period of time are not consistent with the first well model for the hydrocarbon well: determining, based on the second set of operating parameters for the hydrocarbon well, a second skin factor ($S_2$) for the hydrocarbon well; and determining, based on the second skin factor ($S_2$) for the hydrocarbon well, a second well model for the hydrocarbon well that defines a second relationship of flowing well pressure of the hydrocarbon well to production flowrate of the hydrocarbon well; determining, based on the second well model for the hydrocarbon well, an operating parameter for the hydrocarbon well; and operating the hydrocarbon well in accordance with the operating parameter.

In some embodiments, the first skin factor and the second skin factor are determined based on the following relationship:

$$S = \frac{kh(P_e - P_{wf})}{141.2B_o\mu Q} - \ln\left(\frac{r_e}{r_w}\right)$$

where:
q=production flow rate;
k=permeability;
h=reservoir thickness;
$P_e$=reservoir pressure;
$P_{wf}$=flowing bottom hole pressure;
$B_o$=oil volume factor;
μ=viscosity;
$r_e$=reservoir radius; and
$r_w$=wellbore radius.

In some embodiments, the method further includes: determining, based on the first relationship of flowing well pressure of the hydrocarbon well to production flowrate of the hydrocarbon well, a first operating point for the hydrocarbon well that defines a first operating flowing well pressure and a first operating production flowrate for the hydrocarbon well, wherein the first acceptable range of flowing well pressure is determined based on the first operating flowing well pressure, and wherein the first acceptable range of production flowrate is determined based on the first operating production flowrate. In certain embodiments, the first well model for the hydrocarbon well comprises: a first inflow performance relationship (IPR) for the hydrocarbon well that is associated with the first skin factor ($S_1$) for the hydrocarbon well; and a vertical lift performance (VLP) for the hydrocarbon well, and where the first operating point corresponds to an intersection of the first IPR for the hydrocarbon well and the VLP for the hydrocarbon well. In some embodiments, the method further includes: determining, a third set of operating parameters for the hydrocarbon well that are indicative of observed performance of the hydrocarbon well over a third period of time that is subsequent to the second period of time; determining, based on the third set of operating parameters for the hydrocarbon well, well performance characteristics for the third period of time that comprise: a flowing well pressure of the hydrocarbon well for the third period of time; and a production flowrate of the hydrocarbon well for the third period of time; determining, based on a comparison of the well performance characteristics for the third period of time to the second well model for the hydrocarbon well, that the well performance characteristics for the third period of time are not consistent with the second well model for the hydrocarbon well, the determining that the well performance characteristics for the third period of time are not consistent with the second well model for the hydrocarbon well comprising: determining, based on the second relationship of flowing well pressure of the hydrocarbon well to production flowrate of the hydrocarbon well: a second acceptable range of flowing well pressure; and a second acceptable range of production flowrate; determining that at least one of the flowing well pressure of the hydrocarbon well for the third period of time does not correspond to the second acceptable range of flowing well pressure or the production flowrate of the hydrocarbon well for the third period of time does not correspond to the second acceptable range of production flowrate; and determining, in response to determining that at least one of the flowing well pressure of the hydrocarbon well for the third period of time does not correspond to the second acceptable range of flowing well pressure or the production flowrate of the hydrocarbon well for the third period of time does not correspond to the second acceptable range of production flowrate, that the well performance characteristics for the third period of time are not consistent with the second well model for the hydrocarbon well; in response to determining that the well performance characteristics for the third period of time are not consistent with the second well model for the hydrocarbon well: determining, based on the third set of operating parameters for the hydrocarbon well, a third skin factor ($S_3$) for the hydrocarbon well; and determining, based on the third skin factor ($S_3$) for the hydrocarbon well, a third well model for the hydrocarbon well that defines a third relationship of flowing well pressure of the hydrocarbon well to production flowrate of the hydrocarbon well; determining, based on the third well model for the hydrocarbon well, a second operating parameter for the hydrocarbon well; and operating the hydrocarbon well in accordance with the second operating parameter. In certain embodiments, the method further includes: determining, based on the second relationship of flowing well pressure of the hydrocarbon well to production flowrate of the hydrocarbon well, a second operating point for the hydrocarbon well that defines a second operating flowing well pressure and a second operating production flowrate for the hydrocarbon well, where the second acceptable range of flowing well pressure is determined based on the second operating flowing well pressure, and where the second acceptable range of production flowrate is determined based on the second operating production flowrate. In some embodiments, the second well model for the hydrocarbon well comprises: a second inflow performance relationship (IPR) for the hydrocarbon well that is associated with the second skin factor ($S_2$) for the hydrocarbon well; and a vertical lift performance (VLP) for the hydrocarbon well, and the second operating point corresponds to an intersection of the second IPR for the hydrocarbon well and the VLP for the hydrocarbon well. In some embodiments, the operating parameter for the hydrocarbon well comprises a production flowrate, and operating the hydrocarbon well in accordance with the operating parameter comprises controlling the well to operate at the production flowrate.

Provided in some embodiments a a hydrocarbon well system that includes: a well production system configured to regulate the flow of hydrocarbon production from a hydrocarbon well; and a well control system configured to perform the following operations: determining a first set of operating parameters for a hydrocarbon well that are indicative of observed performance of the hydrocarbon well over a first period of time; determining, based on the first set of operating parameters for the hydrocarbon well, a first skin factor ($S_1$) for the hydrocarbon well; determining, based on the first skin factor ($S_1$) for the hydrocarbon well, a first well model for the hydrocarbon well that defines a first relationship of flowing well pressure of the hydrocarbon well to production flowrate of the hydrocarbon well; determining, a second set of operating parameters for the hydrocarbon well that are indicative of observed performance of the hydrocarbon well over a second period of time that is subsequent to the first period of time; determining, based on the second set of operating parameters for the hydrocarbon well, well performance characteristics for the second period of time that comprise: a flowing well pressure of the hydrocarbon well for the second period of time; and a production flowrate of the hydrocarbon well for the second period of time; determining, based on a comparison of the well performance characteristics for the second period of time to the first well model for the hydrocarbon well, that the well performance characteristics for the second period of time are not consistent with the first well model for the hydrocarbon well, the determining that the well performance characteristics for the second period of time are not consistent with the first well model for the hydrocarbon well comprising: determining, based on the first relationship of flowing well pressure of the hydrocarbon well to production flowrate of the hydrocarbon well: a first acceptable range of flowing well pressure; and a first acceptable range of production flowrate; determining that at least one of the flowing well pressure of the hydrocarbon well for the second period of time does not correspond to the first acceptable range of flowing well pressure or the production flowrate of the hydrocarbon well for the second period of time does not correspond to the first acceptable range of production flowrate; and determining, in response to determining that at least one of the flowing well pressure of the hydrocarbon well for the second period of time does not correspond to the first acceptable range of flowing well pressure or the production flowrate of the hydrocarbon well for the second period of time does not correspond to the first acceptable range of production flowrate, that the well performance characteristics for the second period of time are not consistent with the first well model for the hydrocarbon well; in response to determining that the well performance characteristics for the second period of time are not consistent with the first well model for the hydrocarbon well: determining, based on the second set of operating parameters for the hydrocarbon well, a second skin factor ($S_2$) for the hydrocarbon well; and determining, based on the second skin factor ($S_2$) for the hydrocarbon well, a second well model for the hydrocarbon well that defines a second relationship of flowing well pressure of the hydrocarbon well to production flowrate of the hydrocarbon well; determining, based on the second well model for the hydrocarbon well, an operating parameter for the hydrocarbon well; and controlling the well production system to operate the hydrocarbon well in accordance with the operating parameter. In some embodiments, the first skin factor and the second skin factor are determined based on the above defined relationship (see also equation 1). In certain embodiments, the operations further include: determining, based on the first relationship of flowing well pressure of the hydrocarbon well to production flowrate of the hydrocarbon well, a first operating point for the hydrocarbon well that defines a first operating flowing well pressure and a first operating production flowrate for the hydrocarbon well, where the first acceptable range of flowing well pressure is determined based on the first operating flowing well pressure, and where the first acceptable range of production flowrate is determined based on the first operating production flowrate. In some embodiments, the first well model for the hydrocarbon well comprises: a first inflow performance relationship (IPR) for the hydrocarbon well that is associated with the first skin factor ($S_1$) for the hydrocarbon well; and a vertical lift performance (VLP) for the hydrocarbon well, and the first operating point corresponds to an intersection of the first IPR for the hydrocarbon well and the VLP for the hydrocarbon well. In certain embodiments, the operations further include: determining, a third set of operating parameters for the hydrocarbon well that are indicative of observed performance of the hydrocarbon well over a third period of time that is subsequent to the second period of time; determining, based on the third set of operating parameters for the hydrocarbon well, well performance characteristics for the third period of time that comprise: a flowing well pressure of the hydrocarbon well for the third period of time; and a production flowrate of the hydrocarbon well for the third period of time; determining, based on a comparison of the well performance characteristics for the third period of time to the second well model for the hydrocarbon well, that the well performance characteristics for the third period of time are not consistent with the second well model for the hydrocarbon well, the determining that the well performance characteristics for the third period of time are not consistent with the second well model for the hydrocarbon well comprising: determining, based on the second relationship of flowing well pressure of the hydrocarbon well to production flowrate of the hydrocarbon well: a second acceptable range of flowing well pressure; and a second acceptable range of production flowrate; determining that at least one of the flowing well pressure of the hydrocarbon well for the third period of time does not correspond to the second acceptable range of flowing well pressure or the production flowrate of the hydrocarbon well for the third period of time does not correspond to the second acceptable range of production flowrate; and determining, in response to determining that at least one of the flowing well pressure of the hydrocarbon well for the third period of time does not correspond to the second acceptable range of flowing well pressure or the production flowrate of the hydrocarbon well for the third period of time does not correspond to the second acceptable range of production flowrate, that the well performance characteristics for the third period of time are not consistent with the second well model for the hydrocarbon well; in response to determining that the well performance characteristics for the third period of time are not consistent with the second well model for the hydrocarbon well: determining, based on the third set of operating parameters for the hydrocarbon well, a third skin factor ($S_3$) for the hydrocarbon well; and determining, based on the third skin factor ($S_3$) for the hydrocarbon well, a third well model for the hydrocarbon well that defines a third relationship of flowing well pressure of the hydrocarbon well to production flowrate of the hydrocarbon well; determining, based on the third well model for the hydrocarbon well, a second operating parameter for the hydrocarbon well; and controlling the well production system to operate the hydrocarbon well in accordance with the second operating parameter.

In certain embodiments, the operations further include: determining, based on the second relationship of flowing well pressure of the hydrocarbon well to production flowrate of the hydrocarbon well, a second operating point for the hydrocarbon well that defines a second operating flowing well pressure and a second operating production flowrate for the hydrocarbon well, where the second acceptable range of flowing well pressure is determined based on the second operating flowing well pressure, and where the second acceptable range of production flowrate is determined based on the second operating production flowrate. In some embodiments, the second well model for the hydrocarbon well comprises: a second inflow performance relationship (IPR) for the hydrocarbon well that is associated with the second skin factor ($S_2$) for the hydrocarbon well; and a vertical lift performance (VLP) for the hydrocarbon well, and the second operating point corresponds to an intersection of the second IPR for the hydrocarbon well and the VLP for the hydrocarbon well. In certain embodiments, the operating parameter for the hydrocarbon well comprises a production flowrate, and controlling the well production system to operate the hydrocarbon well in accordance with the second operating parameter comprises controlling the well production system to operate the hydrocarbon well at the production flowrate.

Provided in some embodiments is a non-transitory computer readable storage medium comprising program instructions stored thereon that are executable by a processor to perform the following operations for developing a hydrocarbon well: determining a first set of operating parameters for a hydrocarbon well that are indicative of observed performance of the hydrocarbon well over a first period of time; determining, based on the first set of operating parameters for the hydrocarbon well, a first skin factor ($S_1$) for the hydrocarbon well; determining, based on the first skin factor ($S_1$) for the hydrocarbon well, a first well model for the hydrocarbon well that defines a first relationship of flowing well pressure of the hydrocarbon well to production flowrate of the hydrocarbon well; determining, a second set of operating parameters for the hydrocarbon well that are indicative of observed performance of the hydrocarbon well over a second period of time that is subsequent to the first period of time; determining, based on the second set of operating parameters for the hydrocarbon well, well performance characteristics for the second period of time that comprise: a flowing well pressure of the hydrocarbon well for the second period of time; and a production flowrate of the hydrocarbon well for the second period of time; determining, based on a comparison of the well performance characteristics for the second period of time to the first well model for the hydrocarbon well, that the well performance characteristics for the second period of time are not consistent with the first well model for the hydrocarbon well, the determining that the well performance characteristics for the second period of time are not consistent with the first well model for the hydrocarbon well comprising: determining, based on the first relationship of flowing well pressure of the hydrocarbon well to production flowrate of the hydrocarbon well: a first acceptable range of flowing well pressure; and a first acceptable range of production flowrate; determining that at least one of the flowing well pressure of the hydrocarbon well for the second period of time does not correspond to the first acceptable range of flowing well pressure or the production flowrate of the hydrocarbon well for the second period of time does not correspond to the first acceptable range of production flowrate; and determining, in response to determining that at least one of the flowing well pressure of the hydrocarbon well for the second period of time does not correspond to the first acceptable range of flowing well pressure or the production flowrate of the hydrocarbon well for the second period of time does not correspond to the first acceptable range of production flowrate, that the well performance characteristics for the second period of time are not consistent with the first well model for the hydrocarbon well; in response to determining that the well performance characteristics for the second period of time are not consistent with the first well model for the hydrocarbon well: determining, based on the second set of operating parameters for the hydrocarbon well, a second skin factor ($S_2$) for the hydrocarbon well; and determining, based on the second skin factor ($S_2$) for the hydrocarbon well, a second well model for the hydrocarbon well that defines a second relationship of flowing well pressure of the hydrocarbon well to production flowrate of the hydrocarbon well; determining, based on the second well model for the hydrocarbon well, an operating parameter for the hydrocarbon well; and operating the hydrocarbon well in accordance with the operating parameter.

In certain embodiments, the first skin factor and the second skin factor are determined based on the above defined relationship (see also equation 1). In some embodiments, the operations further include: determining, based on the first relationship of flowing well pressure of the hydrocarbon well to production flowrate of the hydrocarbon well, a first operating point for the hydrocarbon well that defines a first operating flowing well pressure and a first operating production flowrate for the hydrocarbon well, where the first acceptable range of flowing well pressure is determined based on the first operating flowing well pressure, and where the first acceptable range of production flowrate is determined based on the first operating production flowrate. In certain embodiments, the first well model for the hydrocarbon well comprises: a first inflow performance relationship (IPR) for the hydrocarbon well that is associated with the first skin factor ($S_1$) for the hydrocarbon well; and a vertical lift performance (VLP) for the hydrocarbon well, and the first operating point corresponds to an intersection of the first IPR for the hydrocarbon well and the VLP for the hydrocarbon well. In some embodiments, the operations further include: determining, a third set of operating parameters for the hydrocarbon well that are indicative of observed performance of the hydrocarbon well over a third period of time that is subsequent to the second period of time; determining, based on the third set of operating parameters for the hydrocarbon well, well performance characteristics for the third period of time that comprise: a flowing well pressure of the hydrocarbon well for the third period of time; and a production flowrate of the hydrocarbon well for the third period of time; determining, based on a comparison of the well performance characteristics for the third period of time to the second well model for the hydrocarbon well, that the well performance characteristics for the third period of time are not consistent with the second well model for the hydrocarbon well, the determining that the well performance characteristics for the third period of time are not consistent with the second well model for the hydrocarbon well comprising: determining, based on the second relationship of flowing well pressure of the hydrocarbon well to production flowrate of the hydrocarbon well: a second acceptable range of flowing well pressure; and a second acceptable range of production flowrate; determining that at least one of the flowing well pressure of the hydrocarbon well for the third period of time does not correspond to the second acceptable range of flowing well pressure or the production flowrate of the hydrocarbon well for the third period of time does not correspond to the second acceptable range of production flowrate; and determining, in response to determining that at least one of the flowing well pressure of the hydrocarbon well for the third period of time does not correspond to the second acceptable range of flowing well pressure or the production flowrate of the hydrocarbon well for the third period of time does not correspond to the second acceptable range of production flowrate, that the well performance characteristics for the third period of time are not consistent with the second well model for the hydrocarbon well; in response to determining that the well performance characteristics for the third period of time are not consistent with the second well model for the hydrocarbon well: determining, based on the third set of operating parameters for the hydrocarbon well, a third skin factor ($S_3$) for the hydrocarbon well; and determining, based on the third skin factor ($S_3$) for the hydrocarbon well, a third well model for the hydrocarbon well that defines a third relationship of flowing well pressure of the hydrocarbon well to production flowrate of the hydrocarbon well; determining, based on the third well model for the hydrocarbon well, a second operating parameter for the hydrocarbon well; and operating the hydrocarbon well in accordance with the second operating parameter. In certain embodiments, the operations further include: determining, based on the second relationship of flowing well pressure of the hydrocarbon well to production flowrate of the hydrocarbon well, a second operating point for the hydrocarbon well that defines a second operating flowing well pressure and a second operating production flowrate for the hydrocarbon well, where the second acceptable range of flowing well pressure is determined based on the second operating flowing well pressure, and where the second acceptable range of production flowrate is determined based on the second operating production flowrate. In some embodiments, the second well model for the hydrocarbon well comprises: a second inflow performance relationship (IPR) for the hydrocarbon well that is associated with the second skin factor ($S_2$) for the hydrocarbon well; and a vertical lift performance (VLP) for the hydrocarbon well, and the second operating point corresponds to an intersection of the second IPR for the hydrocarbon well and the VLP for the hydrocarbon well. In certain embodiments, where the operating parameter for the hydrocarbon well comprises a production flowrate, and operating the hydrocarbon well in accordance with the operating parameter comprises controlling the well to operate at the production flowrate.

BRIEF DESCRIPTION OF THE DRAWINGS

FIGS. 3A and 3B are diagrams that illustrate example well operating parameters in accordance with one or more embodiments.

Figure 1:
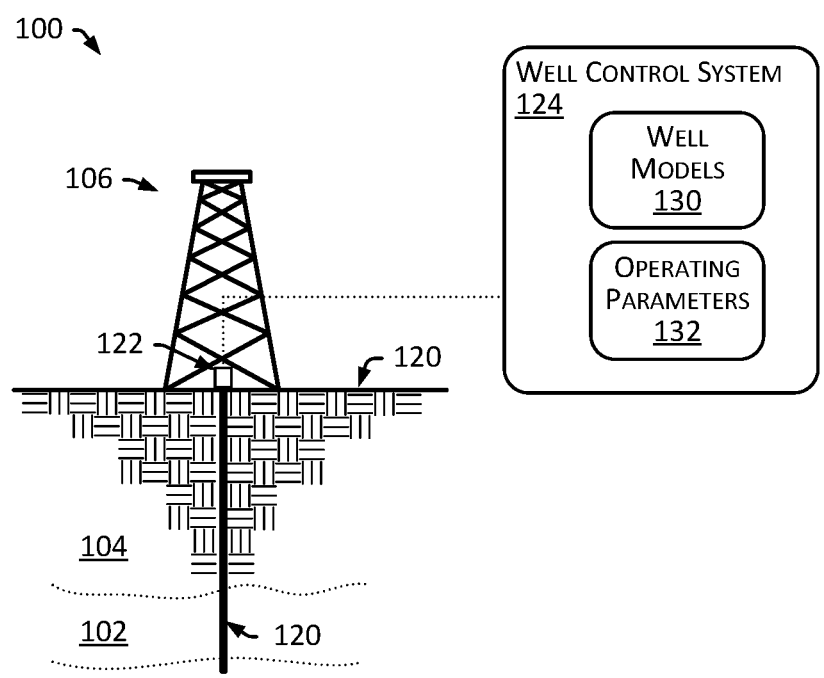
FIG. 1 is diagram that illustrates a well environment in accordance with one or more embodiments.

While this disclosure is susceptible to various modifications and alternative forms, specific embodiments are shown by way of example in the drawings and will be described in detail. The drawings may not be to scale. It should be understood that the drawings and the detailed descriptions are not intended to limit the disclosure to the particular form disclosed, but are intended to disclose modifications, equivalents, and alternatives falling within the scope of the present disclosure as defined by the claims.

DETAILED DESCRIPTION

Described are embodiments of novel systems and method for developing a hydrocarbon well based on dynamic updating of a skin factor (S) (and corresponding well models) to reflect observed performance of the well. In some embodiments, the well model associated with a hydrocarbon well is dynamically updated to reflect the current performance of the well. This may include, for example, the following operations: (1) determining a first set of operating parameters for a hydrocarbon well that are indicative of observed performance of the well over a first period of time; (2) determining, based on the first set of operating parameters for the well, a first/initial skin factor ($S_1$) for the well; (3) determining, based on the first/initial skin factor ($S_1$) for the well, a first well model for the well that defines a first/initial relationship of flowing well pressure of the well (e.g., flowing bottom hole pressure (FBHP)) to production flowrate of the well; (4) determining, a second set of operating parameters for the well that are indicative of observed performance of the well over a second period of time; (5) determining, based on the second set of operating parameters for the well, well performance characteristics for the second period of time that include the following: (a) a flowing well pressure of the well associated with the second period of time (e.g., an average flowing bottom hole pressure (FBHP) for the second period of time); and (b) a production flowrate of the well for the second period of time (e.g., an average production flowrate (q) of the well for the second period of time); (6) determining, based on a comparison of the well performance characteristics for the second period of time to the first well model for the well, that the well performance characteristics for the second period of time are not consistent with the first well model for the well; (7) in response to determining that the well performance characteristics for the second period of time are not consistent with the first well model for the well: (a) determining, based on the second set of operating parameters for the well, a second/updated skin factor ($S_2$) for the well; and (b) determining, based on the second/updated skin factor ($S_2$) for the well, a second/updated well model for the well that defines a second/updated relationship of flowing well pressure of the well to production flowrate of the well. The second/updated well model may be associated with the well in place of the first/initial well model. A similar dynamic updating process may be completed for the second/updated well model to associate a third/updated well model with the well, and so forth. Such dynamic updating of the well model may ensure that the well model currently associated with the well at any given time reflects operating conditions of the well.

In some embodiments, determining that well performance characteristics for a second period of time are not consistent with the first/initial well model for the hydrocarbon well includes comparing well certain well performance characteristics for the second period of time with acceptable ranges of those well performance characteristics. For example, determining that the well performance characteristics for the second period of time are not consistent with the first well model for the hydrocarbon well may include: (a) determining, based on the first/initial relationship of flowing well pressure of the well to production flowrate of the well, a first/initial acceptable range for each of flowing well pressure and production flowrate; (b) determining that the flowing well pressure of the well for the second period of time does not correspond to the first/initial acceptable range for flowing well pressure, or that the production flowrate of the well for the second period of time does not correspond to the first/initial acceptable range for production flowrate; and (c) determining, in response to the "out-of-range" determination, that the well performance characteristics for the second period of time are not consistent with the first well model for the well. In some embodiments, the well is developed based on a well model currently associated with the well. For example, a well control system (or another operator of the well) may determine, based on the second/updated relationship of flowing well pressure of the second well model for the well, a target production flowrate ($q_T$), and the well control system (or another operator of the well) may control the production system to operate the well at the target production flowrate ($q_T$).

FIG. 1 is a diagram that illustrates a well environment 100 in accordance with one or more embodiments. In the illustrated embodiment, the well environment 100 includes a reservoir ("reservoir") 102 located in a subsurface formation ("formation") 104 and a well system ("well") 106.

The formation 104 may include a porous or fractured rock formation that resides beneath the earth's surface (or "surface") 108. The reservoir 102 may be a hydrocarbon reservoir defined by a portion of the formation 104 that contains (or that is at least determined or expected to contain) a subsurface pool of hydrocarbons, such as oil and gas. The formation 104 and the reservoir 102 may each include layers of rock having varying characteristics, such as varying degrees of permeability, porosity, and fluid saturation. In the case of the well 106 being operated as a production well, the well 106 may be a hydrocarbon production well that is operable to facilitate the extraction of hydrocarbons (or "production") from the reservoir 102.

The well 106 may include a wellbore 120, a production system 122, and a well control system ("control system") 124. The wellbore 120 may be, for example, a bored hole that extends from the surface 108 into a target zone of the formation 104, such as the reservoir 102. The wellbore 120 may be created, for example, by a drill bit of a drilling system of the well 106 boring through the formation 104 and the reservoir 102. An upper end of the wellbore 120 (e.g., located at or near the surface 108) may be referred to as the "up-hole" end of the wellbore 120. A lower end of the wellbore 120 (e.g., terminating in the formation 104) may be referred to as the "down-hole" end of the wellbore 120.

In some embodiments, the production system 122 includes production devices that facilitate that extraction of production from the reservoir 102 by way of the wellbore 120. For example, the production system 122 may include valves, pumps and sensors that are operable to monitor production parameters (e.g., production flowrate, temperature, and pressure) and regulate the flow of production from the wellbore 120. The sensors may include, for example, a flowrate sensor that is operable to sense a rate of the flow of production from the wellbore 120 (e.g., to sense the production flowrate (q) of the well 106), a pressure sensor that is operable to sense pressure at an up-hole end of the wellbore 120 (e.g., a wellhead pressure sensor that is operable to sense a wellhead pressure (WHP) of the well 106), a down-hole pressure sensor that is operable to sense pressure in a lower (or "down-hole") portion of the wellbore 120 (e.g., a bottom hole pressure sensor that is operable to sense a bottom hole pressure (BHP) of the well 106), a down-hole temperature sensor that is operable to sense a temperature in a lower (or "down-hole") portion of the wellbore 120 (e.g., a bottom hole temperature sensor to sense static bottom hole temperature (SBHT) of the well 106), a gas/oil ratio (GOR) sensor that is operable to sense a GOR of production flowing from the wellbore 120, or a water cut sensor that is operable to sense water content of production flowing from the wellbore 120. A BHP or WHP sensed while production is flowing in the wellbore 120 (e.g., q>0) may be referred to as flowing BHP (or "FBHP") or flowing WHP (or "FWHP"), respectively. A BHP or WHP sensed while production is not flowing in the wellbore 120 may be referred to a static BHP (or "SBHP") or static WHP (or "SWHP"), respectively.

In some embodiments, the well control system 124 is operable to control various operations of the well 106, such as well drilling operations, well completion operations, well production operations, or well or formation monitoring operations. For example, the well control system 124 may include a well system memory and a well system processor that are capable of performing the various processing and control operations of the well control system 124 described. In some embodiments, the well control system 124 includes a computer system that is the same as or similar to that of computer system 1000 described with regard to at least FIG. 5.

In some embodiments, the well control system 124 is operable to generate well models 130 for the well 106 based on dynamic updating of a skin factor (S) for the well 106 based on operating parameters 132 of the well 106 that reflect the current performance of the well 106. This may include, for example, the well control system 124 performing the following operations: (1) determining a first set of operating parameters 132 for the well 106 that are indicative of observed performance of the well 106 over a first period of time; (2) determining, based on the first set of operating parameters 132 for the well 106, a first/initial skin factor ($S_1$) for the well 106; (3) determining, based on the first/initial skin factor ($S_1$) for the well 106, a first well model 130 for the well 106 that defines a first/initial relationship of flowing well pressure of the well 106 (e.g., flowing bottom hole pressure (FBHP)) to production flowrate of the well 106; (4) determining, a second set of operating parameters 132 for the well 106 that are indicative of observed performance of the well 106 over a second period of time; (5) determining, based on the second set of operating parameters 132 for the well 106, well performance characteristics for the second period of time that include the following: (a) a flowing well pressure of the well 106 for the second period of time (e.g., an average flowing bottom hole pressure (FBHP) for the second period of time); and (b) a production flowrate of the well 106 for the second period of time (e.g., an average production flowrate (q) for the second period of time); (6) determining, based on a comparison of the well performance characteristics for the second period of time to the first well model 130 for the well 106, that the well performance characteristics for the second period of time are not consistent with the first well model 130 for the well 106; (7) in response to determining that the well performance characteristics for the second period of time are not consistent with the first well model 130 for the well 106: (a) determining, based on the second set of operating parameters 132 for the well 106, a second/updated skin factor ($S_2$) for the well 106; and (b) determining, based on the second/updated skin factor ($S_2$) for the well 106, a second/updated well model 130 for the well 106 that defines a second/updated relationship of flowing well pressure of the well 106 to production flowrate of the well 106. The second/updated well model 130 may be associated with the well 106 in place of the first/initial well model 130. A similar dynamic updating process may be completed for the second/updated well model 130 to associate a third/updated well model 130 with the well 106, and so forth. Such dynamic updating of the well model 130 for the well 106 may ensure that the well model 130 currently associated with the well 106 at any given time reflects observed operating conditions of the well 106.

In some embodiments, determining that well performance characteristics for a second period of time are not consistent with the first/initial well model for the hydrocarbon well may include comparing well certain well performance characteristics for the second period of time with acceptable ranges of those well performance characteristics. For example, determining that the well performance characteristics for the second period of time are not consistent with the first well model 130 for the hydrocarbon well 106 may include: (a) determining, based on the first/initial relationship of flowing well pressure of the well 106 to production flowrate of the well 106, a first/initial acceptable range for each of flowing well pressure and production flowrate; (b) determining that the flowing well pressure of the well 106 for the second period of time does not correspond to the first/initial acceptable range for flowing well pressure, or that the production flowrate of the well 106 for the second period of time does not correspond to the first/initial acceptable range for production flowrate; and (c) determining, in response to the "out-of-range" determination, that the well performance characteristics for the second period of time are not consistent with the first well model 130 for the well 106.

In some embodiments, the well 106 is developed based on a well model 130 currently associated with the well 106. For example, the well control system 124 (or another operator of the well 106) may determine, based on the second/updated relationship of flowing well pressure of the second well model for the well 106, a target production flowrate ($q_T$), and the well control system 124 (or another operator of the well 106) may control the production system 122 to operate the well 106 at the target production flowrate ($q_T$).

Figure 2:
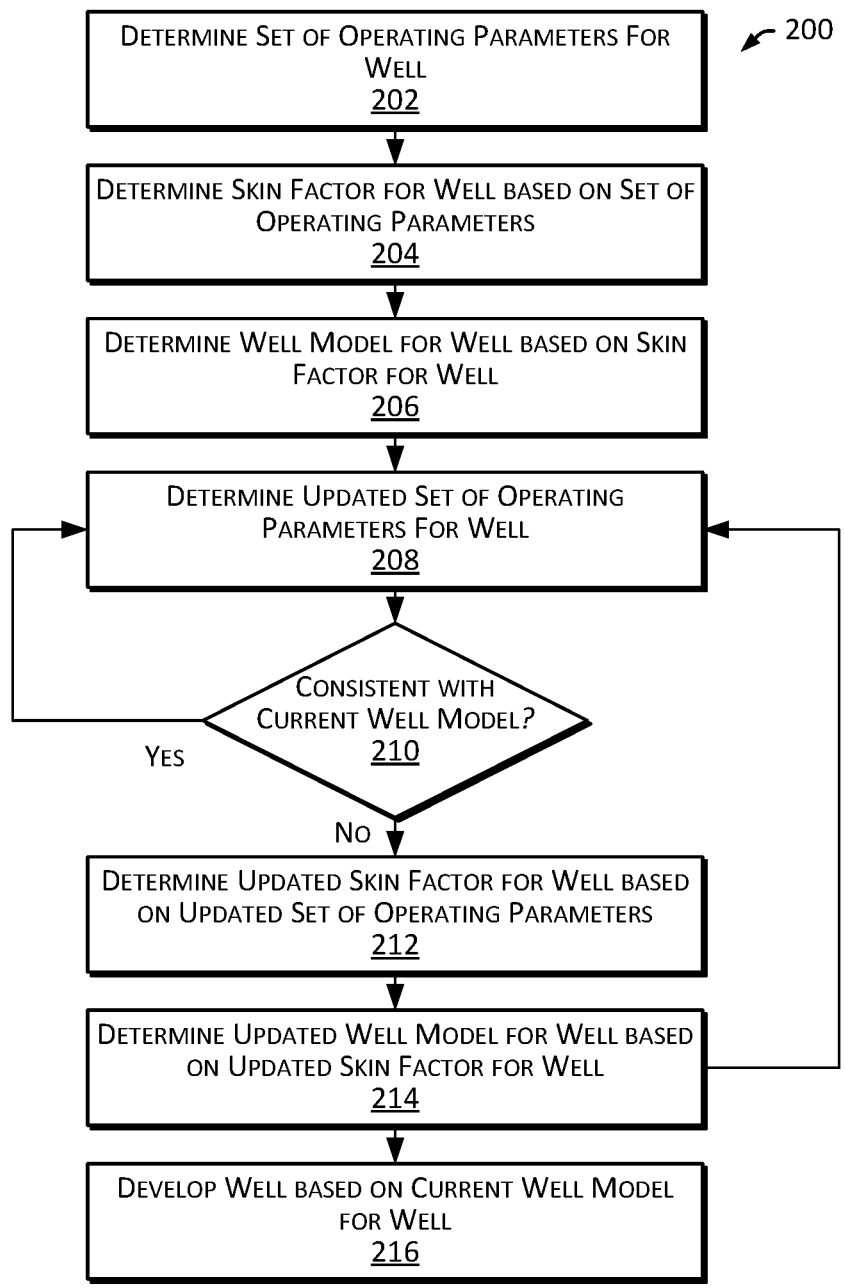
FIG. 2 is a flowchart that illustrates a method of operating a well in accordance with one or more embodiments.

FIG. 2 is a flowchart that illustrates a method 200 of dynamically updating hydrocarbon well models (and developing a hydrocarbon well based thereon) in accordance with one or more embodiments. In the context of the well 106, some or all of the operations of method 200 may be performed by the well control system 124 (or another well operator).

In some embodiments, method 200 includes determining a set of operating parameters for a well (block 202). This may include determining a first/initial set of operating parameters that are indicative of observed performance of the well over a first period of time. For example, determining a set of operating parameters for a well may include the well control system 124 determining a first/initial set of operating parameters 132 for the well 106 that are indicative of observed performance characteristics (and physical characteristics) of the well 106 for the month of January (e.g., from Jan. 1, 2020 to Jan. 31, 2020).

FIG. 3A is a diagram that illustrates an example first/initial set of operating parameters 132a for the well 106 in accordance with one or more embodiments. The first/initial set of operating parameters 132a include values for well performance characteristics (e.g., a static bottom hole pressure (SBHP), a flowing wellhead pressure (FWHP), a gas/oil ratio (GOR), a static bottom hole temperature (SBHT), a water cut, and a flowing bottom hole pressure (FBHP)) and well physical characteristics (e.g., permeability (k), formation thickness (h), viscosity ($\mu$), wellbore radius ($r_w$), reservoir radius ($r_e$), and an oil volume factor ($B_o$)) for the first period of time (e.g., for the month of January). In some embodiments, some or all of the well performance characteristics for a given period of time are indicative of measured values of the performance characteristic over the period of time. For example, the well performance characteristics of the first/initial set of operating parameters 132a may be an average of measured (or "observed") values of the respective characteristic from Jan. 1, 2020 to Jan. 31, 2020. In some embodiments, some or all of the well physical characteristic are determined based on recent logging, simulation, testing or other assessment of the well 106. For example, the well physical characteristics of the first/initial set of operating parameters 132a may be determined from a set of loggings, simulations, tests and other assessments of the well 106 that occurred in December 2019.

In some embodiments, method 200 includes determining a skin factor for the well based on the set of operating parameters for the well (block 204). This may include determining a first/initial skin factor for the well based on the first/initial set of operating parameters for the well. For example, determining a skin factor for the well based on the set of operating parameters for the well may include the well control system 124 determining, based on the first set of operating parameters for the well 106, a first/initial skin factor ($S_1$) for the well 106 that is associated with the month of January. In some embodiments, the skin factor (S) for a well is determined based on the following relationship:

$$S = \frac{kh(P_e - P_{wf})}{141.2 B_o \mu Q} - \ln\left(\frac{r_e}{r_w}\right) \qquad (1)$$

where:
q=production flow rate, stock tank barrels per day (STB/d);
k=permeability, millidarcy (md);
h=reservoir thickness, feet (ft);
$P_e$=reservoir pressure (e.g., SBHP), pounds per square inch (psi);
$P_{wf}$=flowing bottom hole pressure (e.g., FBHP), psi;
$B_o$=oil volume factor, lb/STB;
$\mu$=viscosity, centipoise (cp);
$r_e$=reservoir radius, ft; and
$r_w$=wellbore radius, ft).
For example, a first/initial skin factor ($S_1$) of 13.6 for the well 106 may be determine based on application of the first/initial set of operating parameters 132a to the relationship of equation 1.

In some embodiments, method 200 includes determining a well model for the well based on the skin factor for the well (block 206). This may include determining a first/initial well model for the well based on the first/initial skin factor for the well, and associating the first/initial well model with the well. For example, determining a well model for the well based on the skin factor for the well may include the well control system 124 determining, based on the first/initial skin factor ($S_1$) for the well 106, a first well model 130 for the well 106 that defines a first/initial relationship of flowing well pressure of the well 106 to production flowrate of the well 106. In some embodiments, the flowing well pressure of the well 106 may be the flowing bottom hole pressure (FBHP) of the well 106, the production flowrate of the well 106 may be the production flowrate (q) of the well 106, and the relationship of flowing well pressure of the well 106 to production flowrate of the well 106 may be an inflow performance relationship (IPR) that is associated with the first/initial skin factor ($S_1$) for the well 106. In some embodiments, the well model 130 also includes a vertical lift performance (VLP) for the well 106. The IPR may provide an indication of flow of production from the reservoir 102. The VLP may provide an indication of the flow of production up the wellbore 120, from the bottom hole to the wellhead. The first/initial well model 132a may be stored in association with the well 106.

Figure 4A:
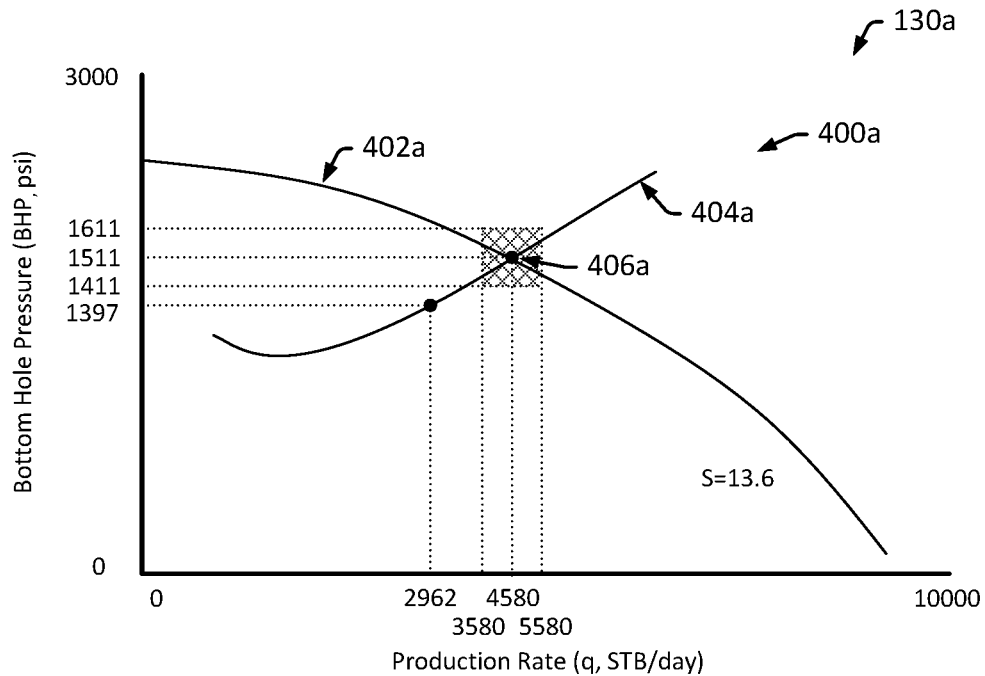
FIGS. 4A and 4B are diagrams that illustrate example well profiles in accordance with one or more embodiments.

FIG. 4A is a diagram that illustrates an example first/initial well model 130a for the well 106 in accordance with one or more embodiments. The first/initial well model 130a includes a first/initial well profile 400a that includes a first/initial IPR curve 402a that is indicative of the relationship of well flowing bottom hole pressure (FBHP) as a function of production rate (q) with the well 106 operating with a skin corresponding to a first/initial skin factor ($S_1$) of 13.6. The first/initial well profile 400 includes a VLP curve 404a that is indicative of the relationship of well bottom hole pressure (BHP) as a function of production rate (q) of the well 106. The intersection of the IPR curve 402a with the VLP curve 404a may define a first/initial operating point 406a that indicates how the well 106 will actually produce for the corresponding set of operating parameters, including with a skin corresponding to the first/initial skin factor ($S_1$) of 13.6.

In some embodiments, method 200 includes determining an updated set of operating parameters for the well (block 208). This may include determining a second/updated set of operating parameters that are indicative of observed performance of the well over a second period of time. For example, determining an updated set of operating parameters for a well may include the well control system 124 determining a second/updated set of operating parameters 132 for the well 106 that are indicative of observed performance characteristics (and physical characteristics) of the well 106 for the month of February (e.g., from Feb. 1, 2020 to Feb. 28, 2020).

FIG. 3B is a diagram that illustrates an example of a second/updated set of operating parameters 132b for the well 106 in accordance with one or more embodiments. The second/updated set of operating parameters 132b include values for well performance characteristics and well physical characteristics for the second period of time (e.g., for the month of February). The well performance characteristics of the second/updated set of operating parameters 132b may be, for example, an average of measured (or "observed") values of the respective characteristic from Feb. 1, 2020 to Feb. 28, 2020. The well physical characteristics of the second/updated set of operating parameters 132b may be, for example, determined from the set of loggings, simulations, tests and other assessments of the well 106 that occurred in December 2019. Notably, the second/updated set of operating parameters 132b include a flowing bottom hole pressure (FBHP=1397 psi) that is less than the flowing bottom hole pressure (FBHP=1511 psi) of the first/initial set of operating parameters 132a, and a production flowrate (q=2,962 STB/day) that is less than the production flowrate (q=4,580 STB/day) of the first/initial set of operating parameters 132a.

In some embodiments, method 200 includes determining whether the updated set of operating parameters for the well are consistent with the well model currently associated with the well (block 210). This may include determining, based on a comparison of the well performance characteristics for the second period of time to the first/initial well model for the well whether the well performance characteristics for the second period of time are consistent with the first/initial well model for the well. For example, determining whether the updated set of operating parameters for the well are consistent with the well model currently associated with the well may include the well control system 124 determining, based on a comparison of the well performance characteristics of the second set of operating parameters 132b to the first well model 130a for the well 106, whether the well performance characteristics for the second period of time are consistent with the first well model 130a for the well 106.

In some embodiments, determining whether the well performance characteristics for the second period of time are consistent with the first/initial well model for a well includes determining whether the flowing well pressure and the production flowrate of the well for the second period of time are consistent with the relationship of flowing well pressure of the well to production flowrate of the well defined by the first/initial well model. For example, determining whether the well performance characteristics for the month of February are not consistent with the first/initial well model 130a for the hydrocarbon well 106 may include: (a) determining, based on the first/initial relationship of flowing well pressure of the well 106 to production flowrate of the well 106 (e.g., based on the first/initial IPR curve 402a), a first/initial acceptable range for each of flowing well pressure and production flowrate; (b) determining whether the flowing well pressure of the well 106 for the month of February corresponds to (e.g., falls within) the first/initial acceptable range for flowing well pressure and whether the production flowrate of the well 106 for the month of February corresponds to (e.g., falls within) the first/initial acceptable range for production flowrate. In response to determining an out-of-range condition (e.g., determining that one or both of the flowing well pressure and the production flowrate of the well 106 for the month of February fall outside of their respective ranges), it may be determined that the well performance characteristics for the second period of time (and the updated set of operating parameters 132b) are not consistent with the first well model 130 for the well 106. In response to determining an in-range condition (e.g., determining that both of the flowing well pressure and the production flowrate of the well 106 for the month of February fall within their respective ranges), it may be determined that the well performance characteristics for the second period of time (and the updated set of operating parameters 132b) are consistent with the first well model 130 for the well 106.

In some embodiments, the acceptable ranges may be defined by offsets from an operating point defined by the well model 130 currently associated with the well. For example, referring to FIG. 4A in which an operating point of 406a is defined by a flowing-well-pressure/production-flowrate value pair defined by a bottom hole pressure (BHP) of 1,511 psi and a production rate (q) of 4,580 STB/day, if the acceptable range of bottom hole pressure (BHP) is defined by a pressure offset of +/−100 psi and the acceptable range of production rate (q) is defined by a flow offset of 1,000 STB/day, then the acceptable range of flowing well pressure may be defined by a upper well pressure threshold of 1,611 psi and a lower well pressure threshold of 1,411 psi, and the acceptable range of production rate (q) may be defined by an upper production flowrate threshold of 5,580 STB/day and a lower production flowrate threshold of 3,580 psi. Thus, for example, if the flowing well pressure of the well 106 for the second period of time is 1,450 psi and the production flowrate of the well 106 for the second period of time is 4,500 STB/day, it may be determined that the well performance characteristics for the second period of time (and the updated set of operating parameters 132b) are consistent with the first/current well model 130a for the well 106. As a further example, if the flowing well pressure of the well 106 for the second period of time is 1,397 psi and the production flowrate of the well 106 for the second period of time is 2,962 STB/day, it may be determined that the well performance characteristics for the second period of time (and the updated set of operating parameters 132b) are not consistent with the first/current well model 130a for the well 106.

In some embodiments, method 200 includes, responsive to determining that the updated set of operating parameters for the well are not consistent with a well model currently associated with the well, determining an updated skin factor for the well based on the updated/current set of operating parameters for the well (block 212) and determining an updated well model for the well based on the updated skin factor for the well (block 214).

Determining an updated/current skin factor for the well based on the updated/current set of operating parameters for the well may include determining an updated skin factor for the well based on the updated set of operating parameters for the well for the second period of time. For example, determining an updated/current skin factor for the well based on the updated/current set of operating parameters for the well may include the well control system 124 determining, based on the second set of operating parameters 132b associated with the month of February, a second/updated skin factor ($S_2$) for the well 106. For example, a second/updated skin factor ($S_2$) of 29.8 may be determine based on application of the second/updated set of operating parameters 132b to the relationship of equation 1.

Determining an updated/current well model for the well based on the updated skin factor for the well may include determining an updated/current well model for the well based on the updated skin factor for the well, and associating the updated/current well model with the well. For example, determining an updated/current well model for the well based on the updated skin factor for the well may include the well control system 124 determining, based on the second/updated skin factor ($S_2$) for the well 106, a second well model 130b for the well 106 that defines a second/updated relationship of flowing well pressure of the well 106 to production flowrate of the well 106.

Figure 4B:
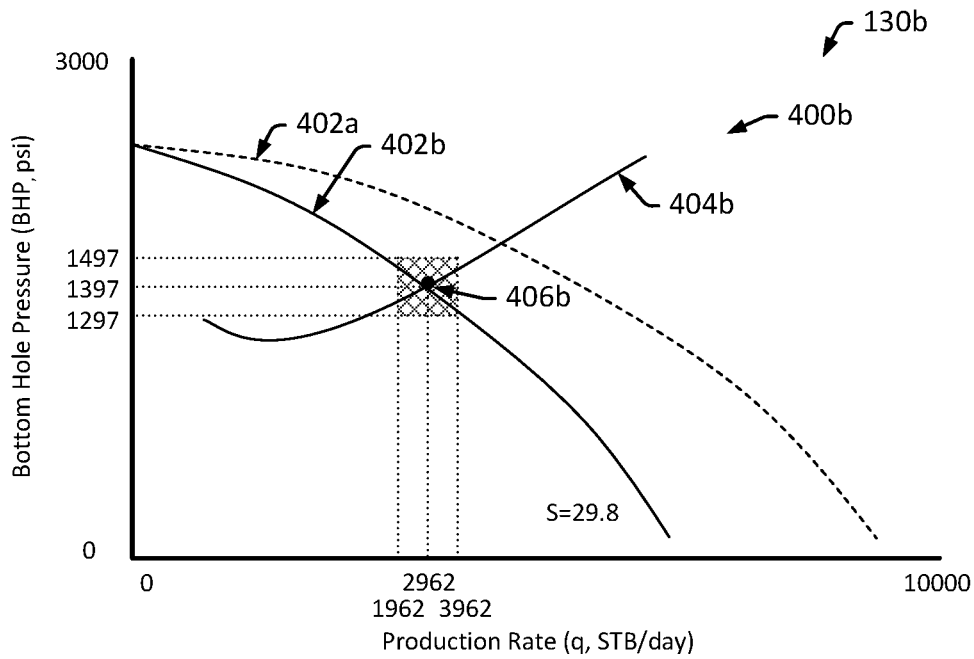

FIG. 4B is a diagram that illustrates an example second/updated well profile 130b for the well 106 in accordance with one or more embodiments. The second/updated well profile 130b includes a second/updated well profile 400b that includes a second/updated IPR curve 402b that is indicative of the relationship of well flowing bottom hole pressure (FBHP) as a function of production rate (q) with the well 106 operating with a skin corresponding to a second/updated skin factor ($S_2$) of 29.8. The second/updated well profile 400b also includes a VLP curve 404b that is indicative of the relationship of well bottom hole pressure (BHP) as a function of production rate (q) of the well 106. The VLP curve 404b may be the same as the VLP curve 404b of FIG. 4A. The intersection of the second/updated IPR curve 402b with the VLP curve 404b may define a second/updated operating point 406b that indicates how the well 106 will actually produce for the corresponding set of operating parameters, including with a skin corresponding to the second/updated skin factor ($S_2$) of 29.8.

In some embodiments, method 200 includes, responsive to determining that the updated set of operating parameters for the well are consistent with a well model currently associated with the well (e.g., at block 210) or determining an updated well model for the well based on the updated skin factor for the well (e.g., at block 214), continuing to update and monitor operating parameters of the well based on the current well model associated with the well (at blocks 208 and 210). This may include, for example, determining a third/updated set of operating parameters 132 that are indicative of observed performance of the well 106 over a third period of time and determining, based on a comparison of the well performance characteristics of the operating parameters 132 for the third period of time to the well model 130 currently associated with the well 106 (e.g., a comparison to the first/initial well model 130a or the second/updated well model 130b) whether the well performance characteristics for the third period of time are consistent with the well model 130 currently associated with the well 106. Such a dynamic updating process may be repeated regularly (e.g., hourly, daily, monthly, quarterly or annually) in an effort to ensure that the well model 130 currently associated with the well 106 at any given time more accurately reflects operating conditions of the well 106.

In some embodiments, method 200 includes developing the well based on the current well model for the well (block 216). This may include determining an operating parameter for the well based on the current well model associated with the well and operating the well in accordance with the operating parameter. For example, developing the well based on the current well model for the well may include the well control system 124 (or another operator of the well 106) determining, based on the second/updated well model 130b, a target production flowrate ($Q_T$) that corresponds to the operating point 406b (e.g., $Q_T$=2,962 STB/day), and the well control system 124 (or another operator of the well 106) controlling one or more devices of the production system 122 (e.g., controlling the positioning of a choke valve of the production system 122) to operate the well 106 at the target production flowrate ($Q_T$). In some embodiments, the operating parameters may be parameters for operations (e.g., an acid stimulation operation, a perforation operations, or the like), and operations may be performed to achieve the operating parameters (e.g., the acid stimulation operation may be conducted, the perforation operation may be conducted to perforate well casing, or the like).

Figure 5:
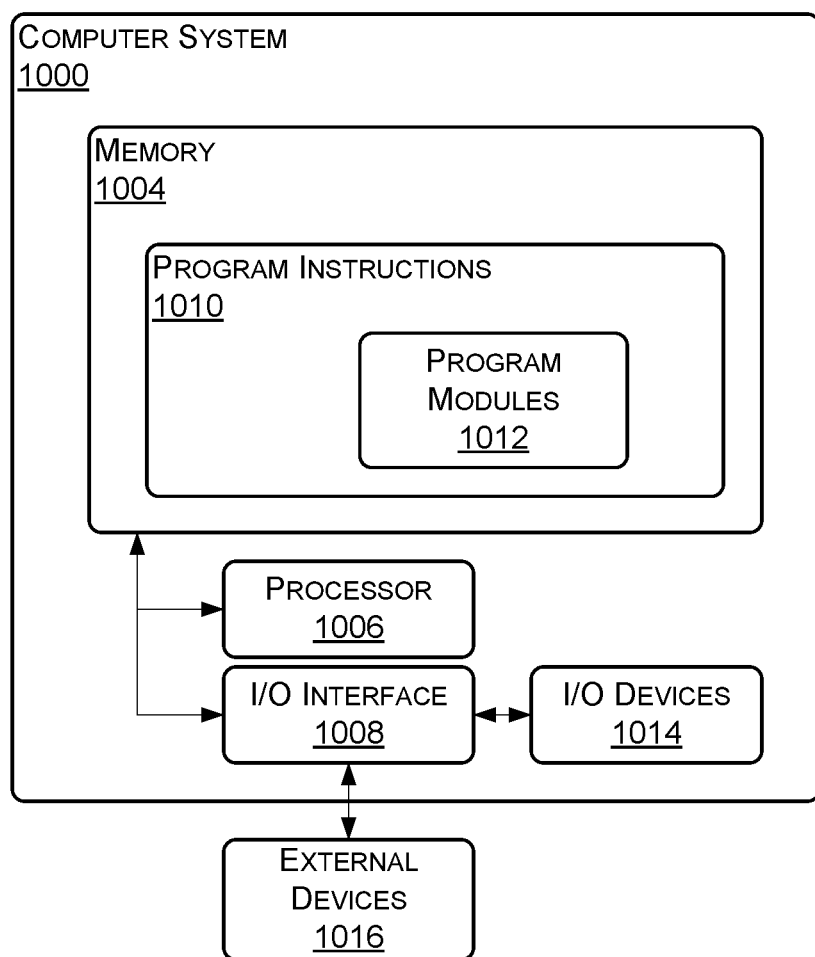
FIG. 5 is a diagram that illustrates an example computer system in accordance with one or more embodiments.

FIG. 5 is a diagram that illustrates an example computer system (or "system") 1000 in accordance with one or more embodiments. In some embodiments, the system 1000 is a programmable logic controller (PLC). The system 1000 may include a memory 1004, a processor 1006 and an input/output (I/O) interface 1008. The memory 1004 may include non-volatile memory (for example, flash memory, read-only memory (ROM), programmable read-only memory (PROM), erasable programmable read-only memory (EPROM), electrically erasable programmable read-only memory (EEPROM)), volatile memory (for example, random access memory (RAM), static random access memory (SRAM), synchronous dynamic RAM (SDRAM)), or bulk storage memory (for example, CD-ROM or DVD-ROM, hard drives). The memory 1004 may include a non-transitory computer-readable storage medium having program instructions 1010 stored thereon. The program instructions 1010 may include program modules 1012 that are executable by a computer processor (for example, the processor 1006) to cause the functional operations described, such as those described with regard to the well control system 124 (or another operator of the well 106), or the method 200.

The processor 1006 may be any suitable processor capable of executing program instructions. The processor 1006 may include a central processing unit (CPU) that carries out program instructions (for example, the program instructions of the program modules 1012) to perform the arithmetical, logical, or input/output operations described. The processor 1006 may include one or more processors. The I/O interface 1008 may provide an interface for communication with one or more I/O devices 1014, such as a joystick, a computer mouse, a keyboard, or a display screen (for example, an electronic display for displaying a graphical user interface (GUI)). The I/O devices 1014 may include one or more of the user input devices. The I/O devices 1014 may be connected to the I/O interface 1008 by way of a wired connection (for example, an Industrial Ethernet connection) or a wireless connection (for example, a Wi-Fi connection). The I/O interface 1008 may provide an interface for communication with one or more external devices 1016. In some embodiments, the I/O interface 1008 includes one or both of an antenna and a transceiver. The external devices 1016 may include, for example, production devices of the production system 122.

Further modifications and alternative embodiments of various aspects of the disclosure will be apparent to those skilled in the art in view of this description. Accordingly, this description is to be construed as illustrative only and is for the purpose of teaching those skilled in the art the general manner of carrying out the embodiments. It is to be understood that the forms of the embodiments shown and described here are to be taken as examples of embodiments. Elements and materials may be substituted for those illustrated and described here, parts and processes may be reversed or omitted, and certain features of the embodiments may be utilized independently, all as would be apparent to one skilled in the art after having the benefit of this description of the embodiments. Changes may be made in the elements described here without departing from the spirit and scope of the embodiments as described in the following claims. Headings used here are for organizational purposes only and are not meant to be used to limit the scope of the description.

It will be appreciated that the processes and methods described here are example embodiments of processes and methods that may be employed in accordance with the techniques described here. The processes and methods may be modified to facilitate variations of their implementation and use. The order of the processes and methods and the operations provided may be changed, and various elements may be added, reordered, combined, omitted, modified, and so forth. Portions of the processes and methods may be implemented in software, hardware, or a combination of software and hardware. Some or all of the portions of the processes and methods may be implemented by one or more of the processors/modules/applications described here.

As used throughout this application, the word "may" is used in a permissive sense (that is, meaning having the potential to), rather than the mandatory sense (that is, meaning must). The words "include," "including," and "includes" mean including, but not limited to. As used throughout this application, the singular forms "a", "an," and "the" include plural referents unless the content clearly indicates otherwise. Thus, for example, reference to "an element" may include a combination of two or more elements. As used throughout this application, the term "or" is used in an inclusive sense, unless indicated otherwise. That is, a description of an element including A or B may refer to the element including one or both of A and B. As used throughout this application, the phrase "based on" does not limit the associated operation to being solely based on a particular item. Thus, for example, processing "based on" data A may include processing based at least in part on data A and based at least in part on data B, unless the content clearly indicates otherwise. As used throughout this application, the term "from" does not limit the associated operation to being directly from. Thus, for example, receiving an item "from" an entity may include receiving an item directly from the entity or indirectly from the entity (for example, by way of an intermediary entity). Unless specifically stated otherwise, as apparent from the discussion, it is appreciated that throughout this specification discussions utilizing terms such as "processing," "computing," "calculating," "determining," or the like refer to actions or processes of a specific apparatus, such as a special purpose computer or a similar special purpose electronic processing/computing device. In the context of this specification, a special purpose computer or a similar special purpose electronic processing/computing device is capable of manipulating or transforming signals, typically represented as physical, electronic or magnetic quantities within memories, registers, or other information storage devices, transmission devices, or display devices of the special purpose computer or similar special purpose electronic processing/computing device.

What is claimed is:

1. A method of developing a hydrocarbon well, the method comprising:
   determining a first set of operating parameters for a hydrocarbon well that are indicative of observed performance of the hydrocarbon well over a first period of time;
   determining, based on the first set of operating parameters for the hydrocarbon well, a first skin factor ($S_1$) for the hydrocarbon well;
   determining, based on the first skin factor ($S_1$) for the hydrocarbon well, a first well model for the hydrocarbon well that defines a first relationship of flowing well pressure of the hydrocarbon well to production flowrate of the hydrocarbon well;
   determining, a second set of operating parameters for the hydrocarbon well that are indicative of observed performance of the hydrocarbon well over a second period of time that is subsequent to the first period of time;
   determining, based on the second set of operating parameters for the hydrocarbon well, well performance characteristics for the second period of time that comprise:
      a flowing well pressure of the hydrocarbon well for the second period of time; and
      a production flowrate of the hydrocarbon well for the second period of time;
   determining, based on a comparison of the well performance characteristics for the second period of time to the first well model for the hydrocarbon well, that the well performance characteristics for the second period of time are not consistent with the first well model for the hydrocarbon well, the determining that the well performance characteristics for the second period of time are not consistent with the first well model for the hydrocarbon well comprising:
      determining, based on the first relationship of flowing well pressure of the hydrocarbon well to production flowrate of the hydrocarbon well:
         a first acceptable range of flowing well pressure; and
         a first acceptable range of production flowrate;
      determining that at least one of the flowing well pressure of the hydrocarbon well for the second period of time does not correspond to the first acceptable range of flowing well pressure or the production flowrate of the hydrocarbon well for the second period of time does not correspond to the first acceptable range of production flowrate; and
      determining, in response to determining that at least one of the flowing well pressure of the hydrocarbon well for the second period of time does not correspond to the first acceptable range of flowing well pressure or the production flowrate of the hydrocarbon well for the second period of time does not correspond to the first acceptable range of production flowrate, that the well performance characteristics for the second period of time are not consistent with the first well model for the hydrocarbon well;
   in response to determining that the well performance characteristics for the second period of time are not consistent with the first well model for the hydrocarbon well:
      determining, based on the second set of operating parameters for the hydrocarbon well, a second skin factor ($S_2$) for the hydrocarbon well; and
      determining, based on the second skin factor ($S_2$) for the hydrocarbon well, a second well model for the hydrocarbon well that defines a second relationship of flowing well pressure of the hydrocarbon well to production flowrate of the hydrocarbon well;
   determining, based on the second well model for the hydrocarbon well, an operating parameter for the hydrocarbon well; and
   operating the hydrocarbon well in accordance with the operating parameter.

2. The method of claim 1, wherein the first skin factor and the second skin factor are determined based on the following relationship:

$$S = \frac{kh(P_e - P_{wf})}{141.2 B_o \mu Q} - \ln\left(\frac{r_e}{r_w}\right)$$

where:
   q=production flow rate;
   k=permeability;
   h=reservoir thickness;
   $P_e$=reservoir pressure;
   $P_{wf}$=flowing bottom hole pressure;
   $B_o$=oil volume factor;
   µ=viscosity;
   $r_e$=reservoir radius; and
   $r_w$=wellbore radius.

3. The method of claim 1, further comprising:
   determining, based on the first relationship of flowing well pressure of the hydrocarbon well to production flowrate of the hydrocarbon well, a first operating point for the hydrocarbon well that defines a first operating flowing well pressure and a first operating production flowrate for the hydrocarbon well,
   wherein the first acceptable range of flowing well pressure is determined based on the first operating flowing well pressure, and
   wherein the first acceptable range of production flowrate is determined based on the first operating production flowrate.

4. The method of claim 3,
wherein the first well model for the hydrocarbon well comprises:
- a first inflow performance relationship (IPR) for the hydrocarbon well that is associated with the first skin factor ($S_1$) for the hydrocarbon well; and
- a vertical lift performance (VLP) for the hydrocarbon well, and wherein the first operating point corresponds to an intersection of the first IPR for the hydrocarbon well and the VLP for the hydrocarbon well.

5. The method of claim 1, further comprising:
determining, a third set of operating parameters for the hydrocarbon well that are indicative of observed performance of the hydrocarbon well over a third period of time that is subsequent to the second period of time;
determining, based on the third set of operating parameters for the hydrocarbon well, well performance characteristics for the third period of time that comprise:
- a flowing well pressure of the hydrocarbon well for the third period of time; and
- a production flowrate of the hydrocarbon well for the third period of time;

determining, based on a comparison of the well performance characteristics for the third period of time to the second well model for the hydrocarbon well, that the well performance characteristics for the third period of time are not consistent with the second well model for the hydrocarbon well, the determining that the well performance characteristics for the third period of time are not consistent with the second well model for the hydrocarbon well comprising:
determining, based on the second relationship of flowing well pressure of the hydrocarbon well to production flowrate of the hydrocarbon well:
- a second acceptable range of flowing well pressure; and
- a second acceptable range of production flowrate;

determining that at least one of the flowing well pressure of the hydrocarbon well for the third period of time does not correspond to the second acceptable range of flowing well pressure or the production flowrate of the hydrocarbon well for the third period of time does not correspond to the second acceptable range of production flowrate; and
determining, in response to determining that at least one of the flowing well pressure of the hydrocarbon well for the third period of time does not correspond to the second acceptable range of flowing well pressure or the production flowrate of the hydrocarbon well for the third period of time does not correspond to the second acceptable range of production flowrate, that the well performance characteristics for the third period of time are not consistent with the second well model for the hydrocarbon well;

in response to determining that the well performance characteristics for the third period of time are not consistent with the second well model for the hydrocarbon well:
determining, based on the third set of operating parameters for the hydrocarbon well, a third skin factor ($S_3$) for the hydrocarbon well; and
determining, based on the third skin factor ($S_3$) for the hydrocarbon well, a third well model for the hydrocarbon well that defines a third relationship of flowing well pressure of the hydrocarbon well to production flowrate of the hydrocarbon well;

determining, based on the third well model for the hydrocarbon well, a second operating parameter for the hydrocarbon well; and
operating the hydrocarbon well in accordance with the second operating parameter.

6. The method of claim 5, further comprising:
determining, based on the second relationship of flowing well pressure of the hydrocarbon well to production flowrate of the hydrocarbon well, a second operating point for the hydrocarbon well that defines a second operating flowing well pressure and a second operating production flowrate for the hydrocarbon well,
wherein the second acceptable range of flowing well pressure is determined based on the second operating flowing well pressure, and
wherein the second acceptable range of production flowrate is determined based on the second operating production flowrate.

7. The method of claim 6,
wherein the second well model for the hydrocarbon well comprises:
- a second inflow performance relationship (IPR) for the hydrocarbon well that is associated with the second skin factor ($S_2$) for the hydrocarbon well; and
- a vertical lift performance (VLP) for the hydrocarbon well, and wherein the second operating point corresponds to an intersection of the second IPR for the hydrocarbon well and the VLP for the hydrocarbon well.

8. The method of claim 1,
wherein the operating parameter for the hydrocarbon well comprises a production flowrate, and
wherein operating the hydrocarbon well in accordance with the operating parameter comprises controlling the well to operate at the production flowrate.

9. A hydrocarbon well system comprising:
a well production system configured to regulate the flow of hydrocarbon production from a hydrocarbon well; and
a well control system configured to perform the following operations:
determining a first set of operating parameters for a hydrocarbon well that are indicative of observed performance of the hydrocarbon well over a first period of time;
determining, based on the first set of operating parameters for the hydrocarbon well, a first skin factor ($S_1$) for the hydrocarbon well;
determining, based on the first skin factor ($S_1$) for the hydrocarbon well, a first well model for the hydrocarbon well that defines a first relationship of flowing well pressure of the hydrocarbon well to production flowrate of the hydrocarbon well;
determining, a second set of operating parameters for the hydrocarbon well that are indicative of observed performance of the hydrocarbon well over a second period of time that is subsequent to the first period of time;
determining, based on the second set of operating parameters for the hydrocarbon well, well performance characteristics for the second period of time that comprise:
- a flowing well pressure of the hydrocarbon well for the second period of time; and
- a production flowrate of the hydrocarbon well for the second period of time;

determining, based on a comparison of the well performance characteristics for the second period of time to the first well model for the hydrocarbon well, that the well performance characteristics for the second period of time are not consistent with the first well model for the hydrocarbon well, the determining that the well performance characteristics for the second period of time are not consistent with the first well model for the hydrocarbon well comprising:
determining, based on the first relationship of flowing well pressure of the hydrocarbon well to production flowrate of the hydrocarbon well:
a first acceptable range of flowing well pressure; and
a first acceptable range of production flowrate;
determining that at least one of the flowing well pressure of the hydrocarbon well for the second period of time does not correspond to the first acceptable range of flowing well pressure or the production flowrate of the hydrocarbon well for the second period of time does not correspond to the first acceptable range of production flowrate; and
determining, in response to determining that at least one of the flowing well pressure of the hydrocarbon well for the second period of time does not correspond to the first acceptable range of flowing well pressure or the production flowrate of the hydrocarbon well for the second period of time does not correspond to the first acceptable range of production flowrate, that the well performance characteristics for the second period of time are not consistent with the first well model for the hydrocarbon well;
in response to determining that the well performance characteristics for the second period of time are not consistent with the first well model for the hydrocarbon well:
determining, based on the second set of operating parameters for the hydrocarbon well, a second skin factor ($S_2$) for the hydrocarbon well; and
determining, based on the second skin factor ($S_2$) for the hydrocarbon well, a second well model for the hydrocarbon well that defines a second relationship of flowing well pressure of the hydrocarbon well to production flowrate of the hydrocarbon well;
determining, based on the second well model for the hydrocarbon well, an operating parameter for the hydrocarbon well; and
controlling the well production system to operate the hydrocarbon well in accordance with the operating parameter.

10. The system of claim 9, wherein the first skin factor and the second skin factor are determined based on the following relationship:

$$S = \frac{kh(P_e - P_{wf})}{141.2 B_o \mu Q} - \ln\left(\frac{r_e}{r_w}\right)$$

where:
q=production flow rate;
k=permeability;
h=reservoir thickness;
$P_e$=reservoir pressure;
$P_{wf}$=flowing bottom hole pressure;
$B_o$=oil volume factor;
$\mu$=viscosity;
$r_e$=reservoir radius; and
$r_w$=wellbore radius.

11. The system of claim 9, the operations further comprising:
determining, based on the first relationship of flowing well pressure of the hydrocarbon well to production flowrate of the hydrocarbon well, a first operating point for the hydrocarbon well that defines a first operating flowing well pressure and a first operating production flowrate for the hydrocarbon well,
wherein the first acceptable range of flowing well pressure is determined based on the first operating flowing well pressure, and
wherein the first acceptable range of production flowrate is determined based on the first operating production flowrate.

12. The system of claim 11,
wherein the first well model for the hydrocarbon well comprises:
a first inflow performance relationship (IPR) for the hydrocarbon well that is associated with the first skin factor ($S_1$) for the hydrocarbon well; and
a vertical lift performance (VLP) for the hydrocarbon well, and
wherein the first operating point corresponds to an intersection of the first IPR for the hydrocarbon well and the VLP for the hydrocarbon well.

13. The system of claim 9, the operations further comprising:
determining, a third set of operating parameters for the hydrocarbon well that are indicative of observed performance of the hydrocarbon well over a third period of time that is subsequent to the second period of time;
determining, based on the third set of operating parameters for the hydrocarbon well, well performance characteristics for the third period of time that comprise:
a flowing well pressure of the hydrocarbon well for the third period of time; and
a production flowrate of the hydrocarbon well for the third period of time;
determining, based on a comparison of the well performance characteristics for the third period of time to the second well model for the hydrocarbon well, that the well performance characteristics for the third period of time are not consistent with the second well model for the hydrocarbon well, the determining that the well performance characteristics for the third period of time are not consistent with the second well model for the hydrocarbon well comprising:
determining, based on the second relationship of flowing well pressure of the hydrocarbon well to production flowrate of the hydrocarbon well:
a second acceptable range of flowing well pressure; and
a second acceptable range of production flowrate;
determining that at least one of the flowing well pressure of the hydrocarbon well for the third period of time does not correspond to the second acceptable range of flowing well pressure or the production flowrate of the hydrocarbon well for the third period of time does not correspond to the second acceptable range of production flowrate; and
determining, in response to determining that at least one of the flowing well pressure of the hydrocarbon well for the third period of time does not correspond to the second acceptable range of flowing well pressure or the production flowrate of the hydrocarbon well for the third period of time does not correspond to the second acceptable range of production flowrate, that the well performance characteristics for the third period of time are not consistent with the second well model for the hydrocarbon well;

in response to determining that the well performance characteristics for the third period of time are not consistent with the second well model for the hydrocarbon well:
  determining, based on the third set of operating parameters for the hydrocarbon well, a third skin factor ($S_3$) for the hydrocarbon well; and
  determining, based on the third skin factor ($S_3$) for the hydrocarbon well, a third well model for the hydrocarbon well that defines a third relationship of flowing well pressure of the hydrocarbon well to production flowrate of the hydrocarbon well;

determining, based on the third well model for the hydrocarbon well, a second operating parameter for the hydrocarbon well; and controlling the well production system to operate the hydrocarbon well in accordance with the second operating parameter.

14. The system of claim 13, the operations further comprising:
  determining, based on the second relationship of flowing well pressure of the hydrocarbon well to production flowrate of the hydrocarbon well, a second operating point for the hydrocarbon well that defines a second operating flowing well pressure and a second operating production flowrate for the hydrocarbon well,
  wherein the second acceptable range of flowing well pressure is determined based on the second operating flowing well pressure, and
  wherein the second acceptable range of production flowrate is determined based on the second operating production flowrate.

15. The system of claim 14,
  wherein the second well model for the hydrocarbon well comprises:
    a second inflow performance relationship (IPR) for the hydrocarbon well that is associated with the second skin factor ($S_2$) for the hydrocarbon well; and
    a vertical lift performance (VLP) for the hydrocarbon well, and
  wherein the second operating point corresponds to an intersection of the second IPR for the hydrocarbon well and the VLP for the hydrocarbon well.

16. The system of claim 9,
  wherein the operating parameter for the hydrocarbon well comprises a production flowrate, and
  wherein controlling the well production system to operate the hydrocarbon well in accordance with the second operating parameter comprises controlling the well production system to operate the hydrocarbon well at the production flowrate.

17. A non-transitory computer readable storage medium comprising program instructions stored thereon that are executable by a processor to perform the following operations for developing a hydrocarbon well:
  determining a first set of operating parameters for a hydrocarbon well that are indicative of observed performance of the hydrocarbon well over a first period of time;

determining, based on the first set of operating parameters for the hydrocarbon well, a first skin factor ($S_1$) for the hydrocarbon well;
  determining, based on the first skin factor ($S_1$) for the hydrocarbon well, a first well model for the hydrocarbon well that defines a first relationship of flowing well pressure of the hydrocarbon well to production flowrate of the hydrocarbon well;
  determining, a second set of operating parameters for the hydrocarbon well that are indicative of observed performance of the hydrocarbon well over a second period of time that is subsequent to the first period of time;
  determining, based on the second set of operating parameters for the hydrocarbon well, well performance characteristics for the second period of time that comprise:
    a flowing well pressure of the hydrocarbon well for the second period of time; and
    a production flowrate of the hydrocarbon well for the second period of time;
  determining, based on a comparison of the well performance characteristics for the second period of time to the first well model for the hydrocarbon well, that the well performance characteristics for the second period of time are not consistent with the first well model for the hydrocarbon well, the determining that the well performance characteristics for the second period of time are not consistent with the first well model for the hydrocarbon well comprising:
    determining, based on the first relationship of flowing well pressure of the hydrocarbon well to production flowrate of the hydrocarbon well:
      a first acceptable range of flowing well pressure; and
      a first acceptable range of production flowrate;
    determining that at least one of the flowing well pressure of the hydrocarbon well for the second period of time does not correspond to the first acceptable range of flowing well pressure or the production flowrate of the hydrocarbon well for the second period of time does not correspond to the first acceptable range of production flowrate; and
    determining, in response to determining that at least one of the flowing well pressure of the hydrocarbon well for the second period of time does not correspond to the first acceptable range of flowing well pressure or the production flowrate of the hydrocarbon well for the second period of time does not correspond to the first acceptable range of production flowrate, that the well performance characteristics for the second period of time are not consistent with the first well model for the hydrocarbon well;
  in response to determining that the well performance characteristics for the second period of time are not consistent with the first well model for the hydrocarbon well:
    determining, based on the second set of operating parameters for the hydrocarbon well, a second skin factor ($S_2$) for the hydrocarbon well; and
    determining, based on the second skin factor ($S_2$) for the hydrocarbon well, a second well model for the hydrocarbon well that defines a second relationship of flowing well pressure of the hydrocarbon well to production flowrate of the hydrocarbon well;
  determining, based on the second well model for the hydrocarbon well, an operating parameter for the hydrocarbon well; and
  operating the hydrocarbon well in accordance with the operating parameter.

18. The medium of claim 17, wherein the first skin factor and the second skin factor are determined based on the following relationship:

$$S = \frac{kh(P_e - P_{wf})}{141.2B_o\mu Q} - \ln\left(\frac{r_e}{r_w}\right)$$

where:
q=production flow rate;
k=permeability;
h=reservoir thickness;
$P_e$=reservoir pressure;
$P_{wf}$=flowing bottom hole pressure;
$B_o$=oil volume factor;
$\mu$=viscosity;
$r_e$=reservoir radius; and
$r_w$=wellbore radius.

19. The medium of claim 17, the operations further comprising:
determining, based on the first relationship of flowing well pressure of the hydrocarbon well to production flowrate of the hydrocarbon well, a first operating point for the hydrocarbon well that defines a first operating flowing well pressure and a first operating production flowrate for the hydrocarbon well,
wherein the first acceptable range of flowing well pressure is determined based on the first operating flowing well pressure, and
wherein the first acceptable range of production flowrate is determined based on the first operating production flowrate.

20. The medium of claim 19,
wherein the first well model for the hydrocarbon well comprises:
a first inflow performance relationship (IPR) for the hydrocarbon well that is associated with the first skin factor ($S_1$) for the hydrocarbon well; and
a vertical lift performance (VLP) for the hydrocarbon well, and
wherein the first operating point corresponds to an intersection of the first IPR for the hydrocarbon well and the VLP for the hydrocarbon well.

21. The medium of claim 17, the operations further comprising:
determining, a third set of operating parameters for the hydrocarbon well that are indicative of observed performance of the hydrocarbon well over a third period of time that is subsequent to the second period of time;
determining, based on the third set of operating parameters for the hydrocarbon well, well performance characteristics for the third period of time that comprise:
a flowing well pressure of the hydrocarbon well for the third period of time; and
a production flowrate of the hydrocarbon well for the third period of time;
determining, based on a comparison of the well performance characteristics for the third period of time to the second well model for the hydrocarbon well, that the well performance characteristics for the third period of time are not consistent with the second well model for the hydrocarbon well, the determining that the well performance characteristics for the third period of time are not consistent with the second well model for the hydrocarbon well comprising:
determining, based on the second relationship of flowing well pressure of the hydrocarbon well to production flowrate of the hydrocarbon well:
a second acceptable range of flowing well pressure; and
a second acceptable range of production flowrate;
determining that at least one of the flowing well pressure of the hydrocarbon well for the third period of time does not correspond to the second acceptable range of flowing well pressure or the production flowrate of the hydrocarbon well for the third period of time does not correspond to the second acceptable range of production flowrate; and
determining, in response to determining that at least one of the flowing well pressure of the hydrocarbon well for the third period of time does not correspond to the second acceptable range of flowing well pressure or the production flowrate of the hydrocarbon well for the third period of time does not correspond to the second acceptable range of production flowrate, that the well performance characteristics for the third period of time are not consistent with the second well model for the hydrocarbon well;
in response to determining that the well performance characteristics for the third period of time are not consistent with the second well model for the hydrocarbon well:
determining, based on the third set of operating parameters for the hydrocarbon well, a third skin factor ($S_3$) for the hydrocarbon well; and
determining, based on the third skin factor ($S_3$) for the hydrocarbon well, a third well model for the hydrocarbon well that defines a third relationship of flowing well pressure of the hydrocarbon well to production flowrate of the hydrocarbon well;
determining, based on the third well model for the hydrocarbon well, a second operating parameter for the hydrocarbon well; and
operating the hydrocarbon well in accordance with the second operating parameter.

22. The medium of claim 21, the operations further comprising:
determining, based on the second relationship of flowing well pressure of the hydrocarbon well to production flowrate of the hydrocarbon well, a second operating point for the hydrocarbon well that defines a second operating flowing well pressure and a second operating production flowrate for the hydrocarbon well,
wherein the second acceptable range of flowing well pressure is determined based on the second operating flowing well pressure, and
wherein the second acceptable range of production flowrate is determined based on the second operating production flowrate.

23. The medium of claim 22,
wherein the second well model for the hydrocarbon well comprises:
a second inflow performance relationship (IPR) for the hydrocarbon well that is associated with the second skin factor ($S_2$) for the hydrocarbon well; and
a vertical lift performance (VLP) for the hydrocarbon well, and
wherein the second operating point corresponds to an intersection of the second IPR for the hydrocarbon well and the VLP for the hydrocarbon well.

24. The medium of claim 17,
wherein the operating parameter for the hydrocarbon well comprises a production flowrate, and
wherein operating the hydrocarbon well in accordance with the operating parameter comprises controlling the well to operate at the production flowrate.

* * * * *